United States Patent [19]

Böhmer et al.

[11] Patent Number: 5,377,476
[45] Date of Patent: Jan. 3, 1995

[54] ARRANGEMENT FOR STORING, TRANSPORTING AND LOADING SUBSTRATES

[75] Inventors: Gudrun Böhmer, Stuttgart; Josef Gentischer, Remshalden; Rolf Lehner, Esslingen; Dieter Modjesch, Nufringen; Wolfgang Schmutz, Zimmern, all of Germany

[73] Assignee: International Business Machines Corporation, Armonk, N.Y.

[21] Appl. No.: 969,292

[22] Filed: Mar. 19, 1993

[51] Int. Cl.[5] .................. H01L 21/00; B65B 31/00
[52] U.S. Cl. ........................... 53/255; 53/169; 53/284.4; 53/284.5; 414/217
[58] Field of Search ............... 53/235, 284.4, 284.5, 53/260, 258, 255, 169; 414/411, 416, 331, DIG. 1, 217

[56] References Cited
U.S. PATENT DOCUMENTS 3,150,263 9/1964 Catlin ........................ 53/284.4
4,480,423 11/1984 Müller ........................ 53/284.4
4,539,794 9/1985 Azzaroni .................... 53/284.4 X
4,699,555 10/1987 Guarino ....................... 414/217
4,758,127 7/1988 Imai et al. ................... 414/411
4,878,799 11/1989 Seto et al. ................... 53/284.4 X

FOREIGN PATENT DOCUMENTS

0151336 8/1985 European Pat. Off. ...... H05K 13/00
3716549 12/1988 Germany ..................... H01L 21/68

Primary Examiner—James F. Coan
Attorney, Agent, or Firm—William D. Sabo

[57] ABSTRACT

Arrangement for storing and transporting substrates under clean room conditions and for loading the substrates into a clean room. The substrates are individually accommodated in cassettes which are positively stackable. By means of a lifting means, the cassettes are positioned external to a loading slot of the clean room. A lateral sealing flap in the cassette is opened and the substrate is moved into the loading slot in a substrate drawer.

10 Claims, 10 Drawing Sheets

ARRANGEMENT FOR STORING, TRANSPORTING AND LOADING SUBSTRATES

DESCRIPTION

The invention concerns an arrangement for storing and transporting substrates under clean room conditions and for loading them into a clean room according to the preamble of claim 1.

During the treatment of substrates, in particular the manufacture of semiconductors, it is known to arrange a larger number of, say, twenty-five substrates in a carrier which, for storage and transport, is sealed in a clean room box. Such an arrangement is described, for example, in EP-A-0 151 336.

Through a lock means, the carrier may be loaded from the clean room box via an opening in the bottom of the box into a clean room where the substrates are successively taken from the carrier and treated. The treated substrates are then reinserted into the carrier and, after all substrates have been treated, the carrier is returned to the clean room box through the lock means.

This so-called SMIF concept (Standard Mechanical Interface) permits storing the substrates under clean room conditions and feeding, loading and treating them substantially automatically under the same conditions. However, the SMIF concept is only economical for treating larger lots. With smaller lot sizes, down to size 1, substrate carriers and clean room boxes are but inadequately occupied so that the cost of automatically loading the substrates into the clean room and the storage space required become intolerable.

For treating smaller lots, the substrates, such as wafers, multilayer ceramic substrates or exposure masks, are normally stored in sealable cassettes each of which accommodates only one substrate. For treatment, the substrates are removed from the cassettes by hand and assembled on the spot in groups in the desired number and inserted into open multiple substrate carriers. These carriers are often loaded by hand into the clean room from where the substrates are picked up by automatic grippers to be treated and subsequently returned to the carriers. After a group of substrates have been treated, they are returned by hand to the cassettes for storage. This frequent manual handling of the substrates leads to heavy particle contamination by friction and contact.

An automatic manipulator means for individual substrates is described in DE-A-37 16 549. With this means, the substrates are stored in individual compartments of a magazine which is moved past a manipulator in a vertically adjustable fashion. The compartments may be loaded through a sealable slot in a clean room wall.

It is the object of the invention to provide an arrangement by which substrates in smaller lot sizes and variable number may be stored, transported and automatically loaded into a clean room for treatment.

This object according to the invention is accomplished by an arrangement of the previously described kind having the features characterized in claim 1.

Preferred embodiments of the invention may be seen from the subclaims.

In the arrangement according to the invention the substrates are individually arranged in sealable cassettes. One side wall of the cassettes is formed with a sealing flap and may be positioned adjacent to a loading slot in the outer partition of the clean In the arrangement according to the invention the substrates are individually arranged in sealable cassettes. One side wall of the cassettes is formed with a sealing flap and may be positioned adjacent to a loading slot in the outer partition of the clean room. The substrate in the cassette is accommodated in a substrate drawer which after the sealing flap has been opened is moved out through the loading slot into the clean room where the substrate is seized by a gripper, removed and treated. Upon completion of treatment, the substrate is returned to the substrate drawer in the reverse order, the drawer is moved back to the cassette, and the cassette is sealed tightly by means of the sealing flap.

In the cassette, the substrate may be stored and transported under clean room conditions. From the cassette the substrate is automatically loaded and unloaded into and from the clean room also under clean room conditions, so that contamination of the substrate is practically eliminated.

As the substrates are individually arranged in cassettes, the storage space required may be optimally adapted to the respective lot size. Similarly, the transport and the automatic loading of the substrates may be flexibly adapted to the respective lot size without any idle times occurring.

For smaller lot sizes and time-consuming treatment processes it may be adequate and economical to withdraw the stored cassettes manually one by one to position them adjacent to the loading slot of the clean room. As the lot sizes and the extent of automation increase, it may be expedient to stack the cassettes on a lifting means positioned outside the partition adjacent to the loading slot and which successively transfers the cassettes with their sealing flap at a predetermined clock to the loading slot. For this purpose, the cassettes may be stacked on the lifting means directly, particularly in cases where there is only a small number of cassettes to be treated and the stored cassettes are positioned immediately adjacent to the loading slot. For a larger number of cassettes and cassettes stored at a distance from the loading slot, it is frequently expedient to use a cassette carrier in which the cassettes are stacked and which is then placed on the lifting means.

For loading and unloading the substrates under clean room conditions, the loading slot is preferably provided with lips projecting towards the outside in the direction of the cassette. In the loading position, the side wall of the cassette adjoins those lips, and the sealing flap opens into them, resting in that position on the inner surface of one of the lips. Contaminants, if any, such as particles, impurities, condensate, adhering to the outside of the sealing flap are sandwiched between the sealing flap and the lip and thus prevented from contacting the substrate. The compressed clean air in the clean room is discharged through the loading slot and contact slits between the lips and the cassette, thus preventing the ingress of contaminating particles during loading and unloading.

The substrate drawer is preferably removed and restored by means of actuators positioned in the cassette and separated from the space accommodating the substrate by inner partitions. This prevents particles coming off the actuators from contaminating the substrate. Activation of the actuators through the closed cassette wall is non-contacting, using for example, magnetic means. As the actuators are separated from the substrate by the inner partition, the actuator mechanism may also be activated through a guide slot in the cassette wall.

For reliably storing the substrate in the cassette so that damage is avoided, the substrate in the substrate drawer is preferably secured between the closed sealing flap and the facing side wall of the cassette. The substrate in the substrate drawer may be additionally secured by springs provided on the inside of the cassette's top surface.

Storage, transport and treatment of the substrates are rendered flexible by the substrates being arranged in separate cassettes. The cassettes may be provided with an automatically readable identifier by which transport, treatment in the clean room and storage may be controlled. In such a case, the substrate is clearly associated with one cassette. After treatment, the substrate is returned to the cassette from which it was taken. According to another embodiment, the cassette may have a window through which an automatically readable identifier of the substrate is optically scanned. In this case, substrate and cassette do not have to be associated with each other, which means that the substrate may be taken from one cassette and returned to another. Given suitably designed handling means, this may favourably influence the flow of the material inside the clean room. In addition, the cassettes may be used for a wider variety of applications.

One way of carrying out the invention is described in detail below with reference to drawings which illustrate only one specific embodiment, in which

FIG. 7b is a horizontal sectional view of the cassette of FIG. 7a;

FIG. 8b is a horizontal sectional view of the cassette of FIG.8a;

Figure 1:
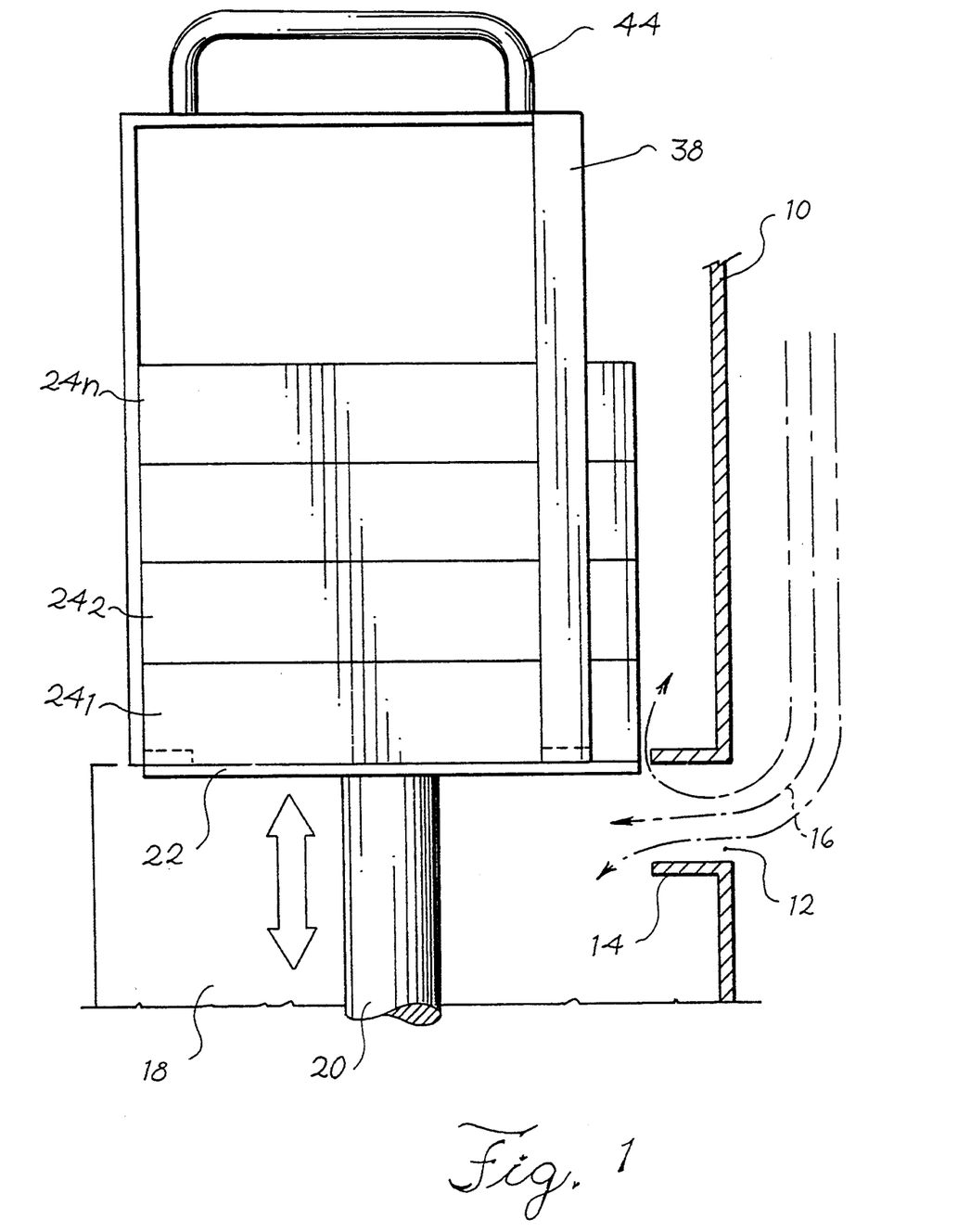
FIG. 1 is a partly sectional schematic side view of the arrangement with the lifting means in the loading position.

In FIG. 1, the outer partition of a clean room containing treatment and handling means, not shown, for the substrates is designated as 10. The treatment and handling means may be arbitrarily designed in a known manner. Partition 10 has a loading slot 12 which is surrounded by lips 14 projecting towards the outside. The clean room is supplied with compressed clean air in a known manner so that a laminar flow 16 of clean air continuously exits through the loading slot 12 and prevents dust particles from entering the clean room through loading slot 12.

External to partition 10, a lifting means 18 is provided which comprises a vertical lifting column 20 along with a horizontal lifting plate 22. The lifting column 20 is clock-controlled by a stepper motor to move the lifting plate 22 past the loading slot 12 and to position it relative thereto. Lifting means 18 in its entirety is enclosed in a housing, the top cover of which is flush with the upper lip 14 of the loading slot 12. The clean air flow 16 exiting through the loading slot 12 thus scavenges the housing of the lifting means 18, keeping dust particles occurring therein away from the loading slot 12.

Figure 2:
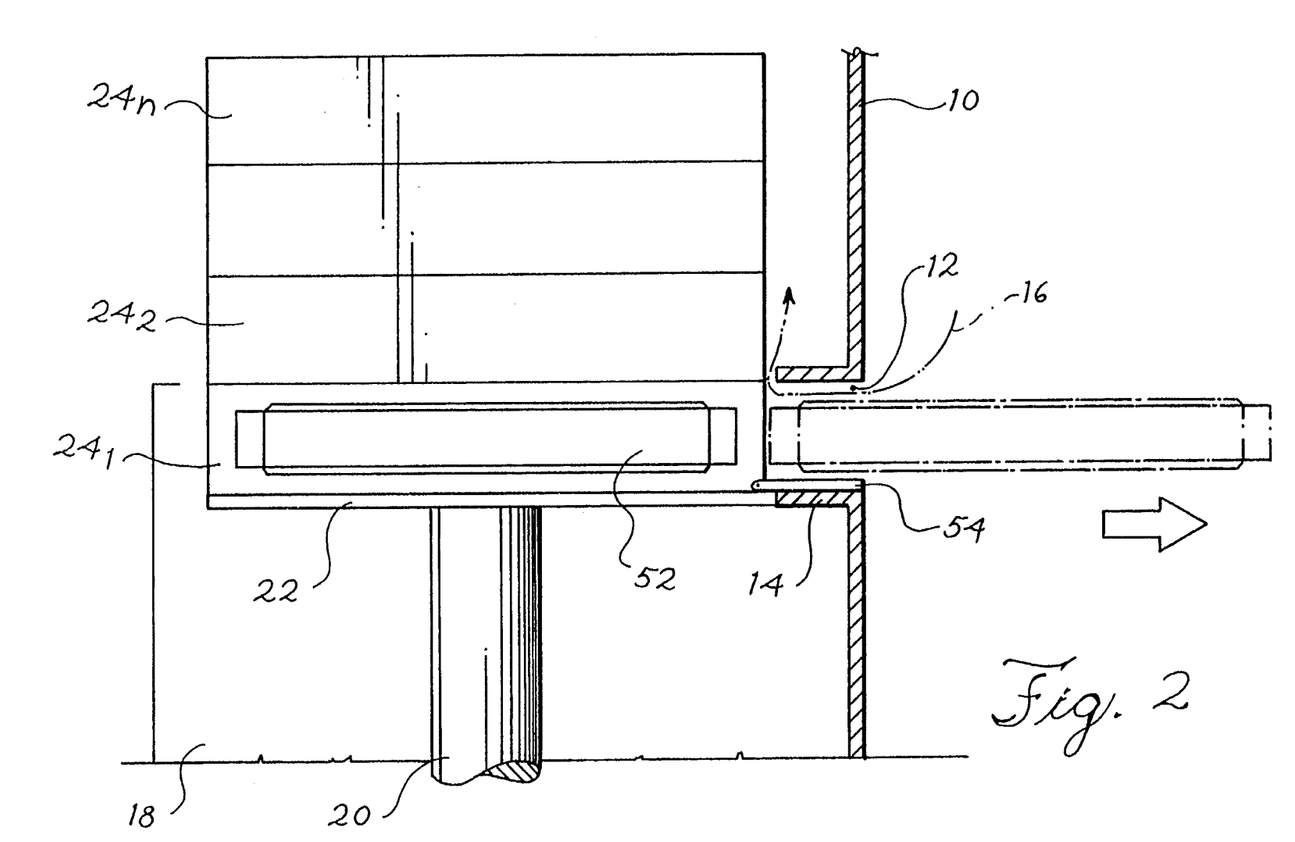
FIG. 2 is a side view also in the loading position.

Several cassettes $24_1$ to $24_n$ may be stacked on the lifting plate 22. For stacking the cassettes 24, the lifting plate 22 is moved to a raised loading position, shown in FIG. 1, in which the lifting plate 22 is above the loading slot 12 and the housing of the lifting means 18. Lifting plate 22 is then lowered in steps, with the cassettes $24_1$ to $24_n$ being moved with one side face to the lips 14 of the loading slot either successively or in an automatically selectable order to be subsequently positioned, as shown in FIG. 2 for the bottom-most cassette $24_1$.

In the illustrated example, the lifting means 18 is vertically movable, the lifting plate 22 is horizontally positioned, and the cassettes $24_1$ and $24_n$, stacked horizontally on the lifting plate 22, are positioned in front of the horizontally arranged loading slot 12. As illustrated, the lifting means may also be designed to be horizontally movable, in which case the cassettes are horizontally moved past the loading slot one after the other and positioned.

Figure 5:
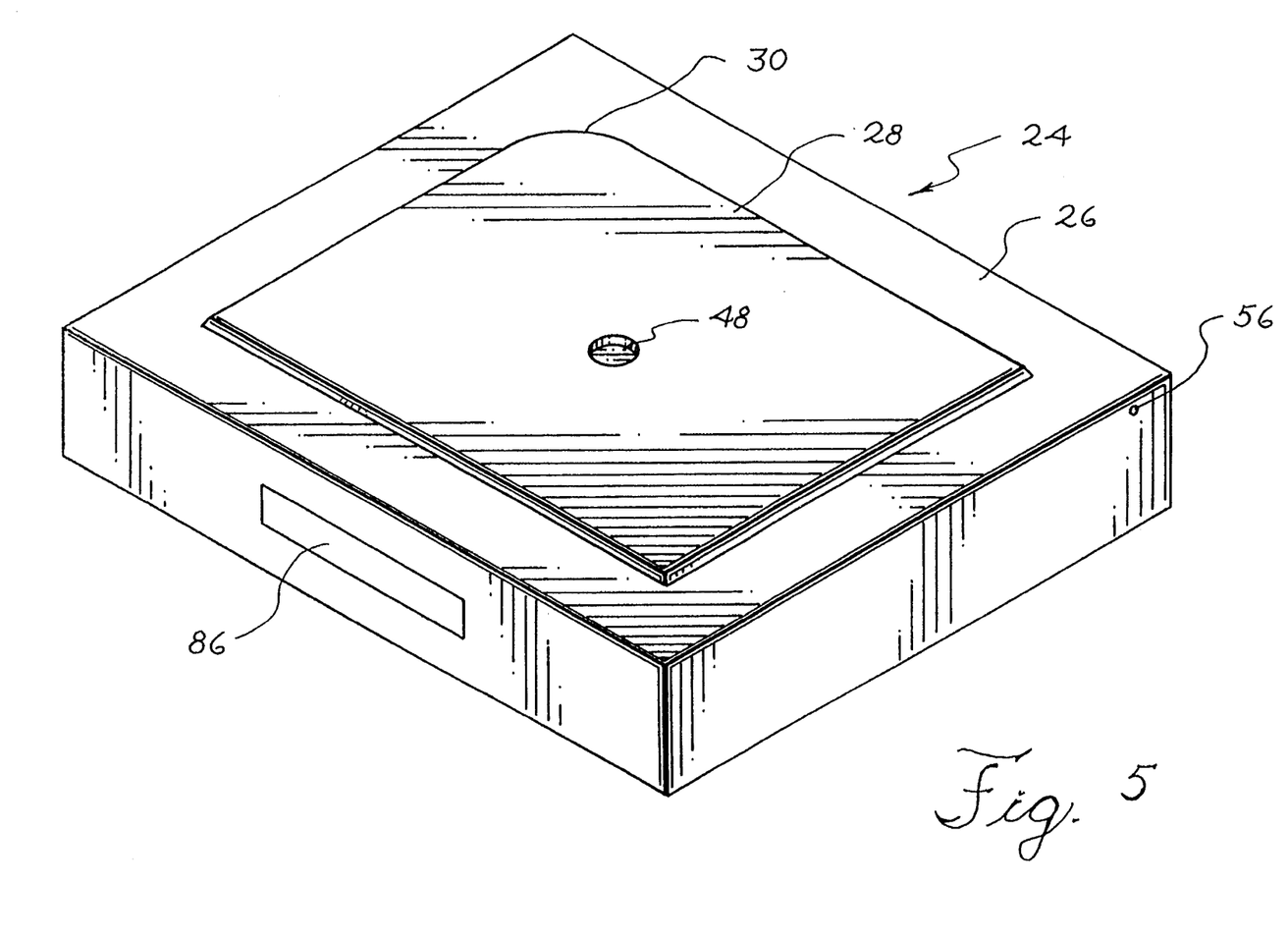
FIG. 5 is a perspective bottom view of a cassette with the side wall opposite to the sealing flap.
Figure 6:
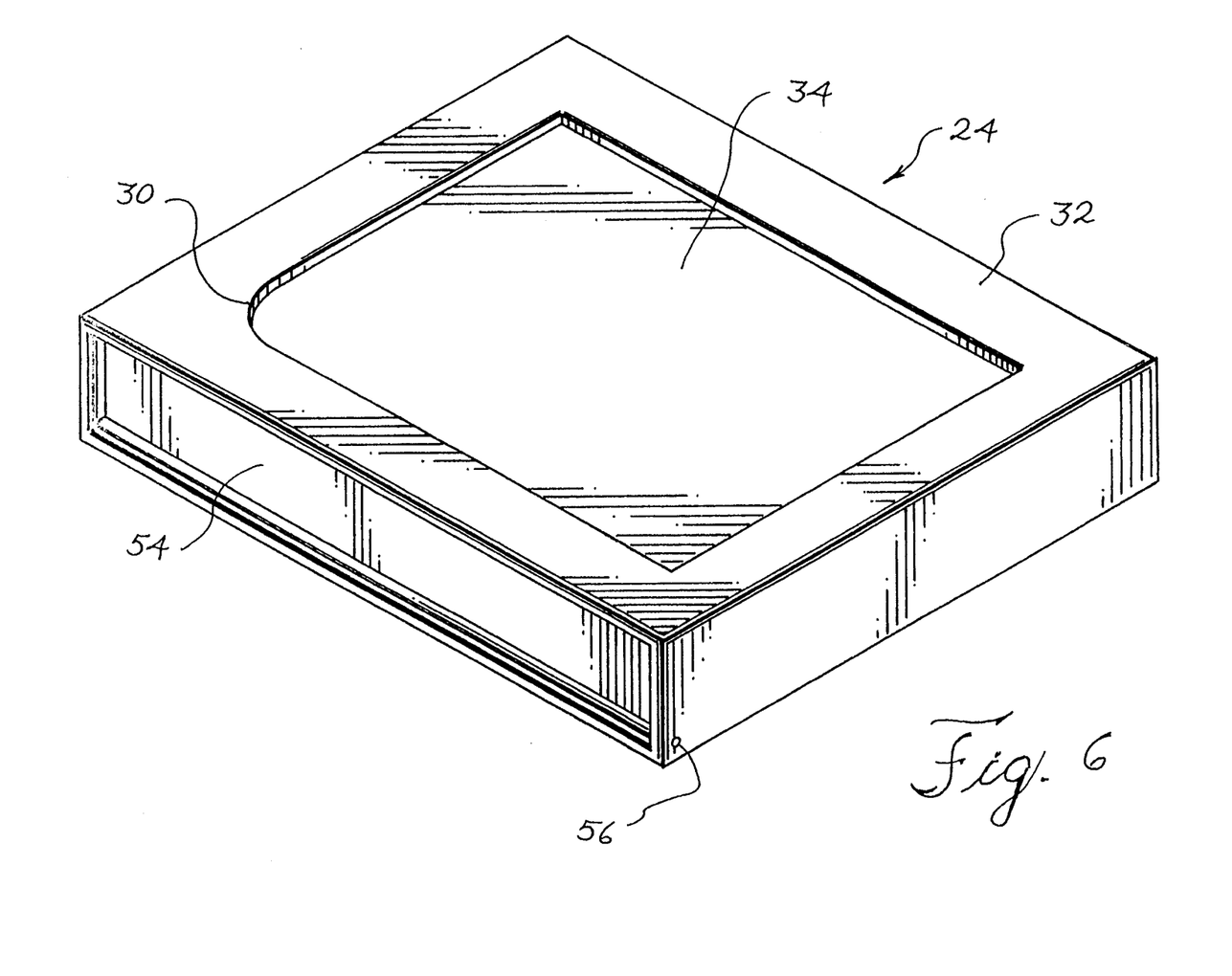
FIG. 6 is a perspective top view of the cassette with the side wall containing the sealing flap.

As shown in FIGS. 5 and 6, the cassettes 24 have a flat cuboid-shaped plastic housing. The bottom side 26 of the cassettes 24 is formed with a projection 28 having a rectangular contour and a rounded edge 30. The top side 32 of the cassette 24 is formed with an indentation 34 complementary to the projection 28. The contour of the indentation 34 corresponds to that of the projection 28 on the bottom side, so that the cassettes 24 are positively stacked on top each other such that their respective projection 28 engages the indentation 34 of the cassette 24 on which they are superimposed. The rounded edge 30 of the projections 28 and the indentations 34 ensures a clear and non-rotatable association.

Figure 4:
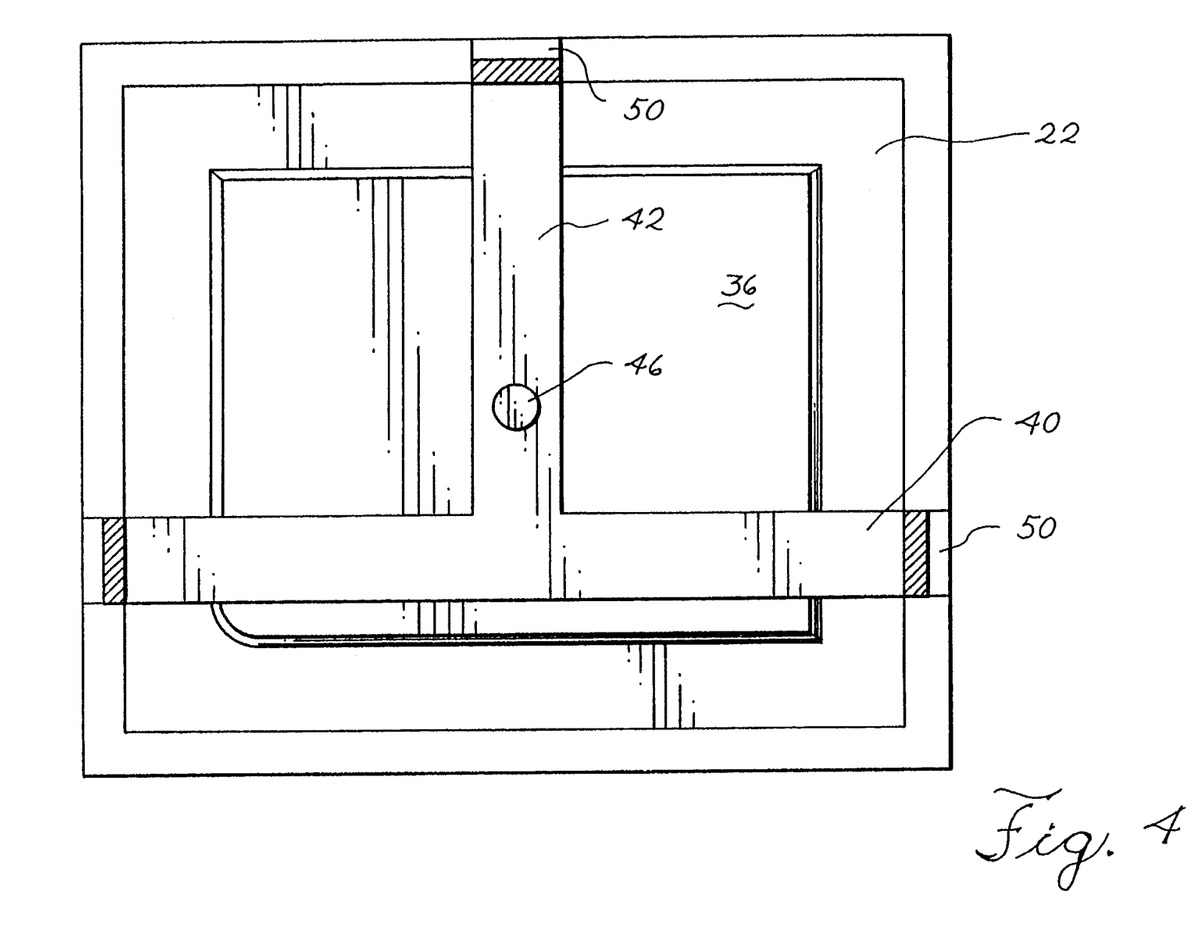
FIG. 4 is a horizontal sectional plan view of the carrier plate of the lifting means with the cassette carrier being empty.

As shown in FIG. 4, the surface of the lifting plate 22 is also provided with an indentation 36 the contour of which corresponds to that of the indentation 34 on the top side of the cassettes 24. As previously described, this allows the cassettes 24 to be positively and accurately stacked on the lifting plate 22. The indentations 34 and 36 as well as the projection 28 are tapered along their edges for ready engagement.

Thus, cassettes 24 may be directly placed on the lifting plate 22 and stacked.

Figure 3A:
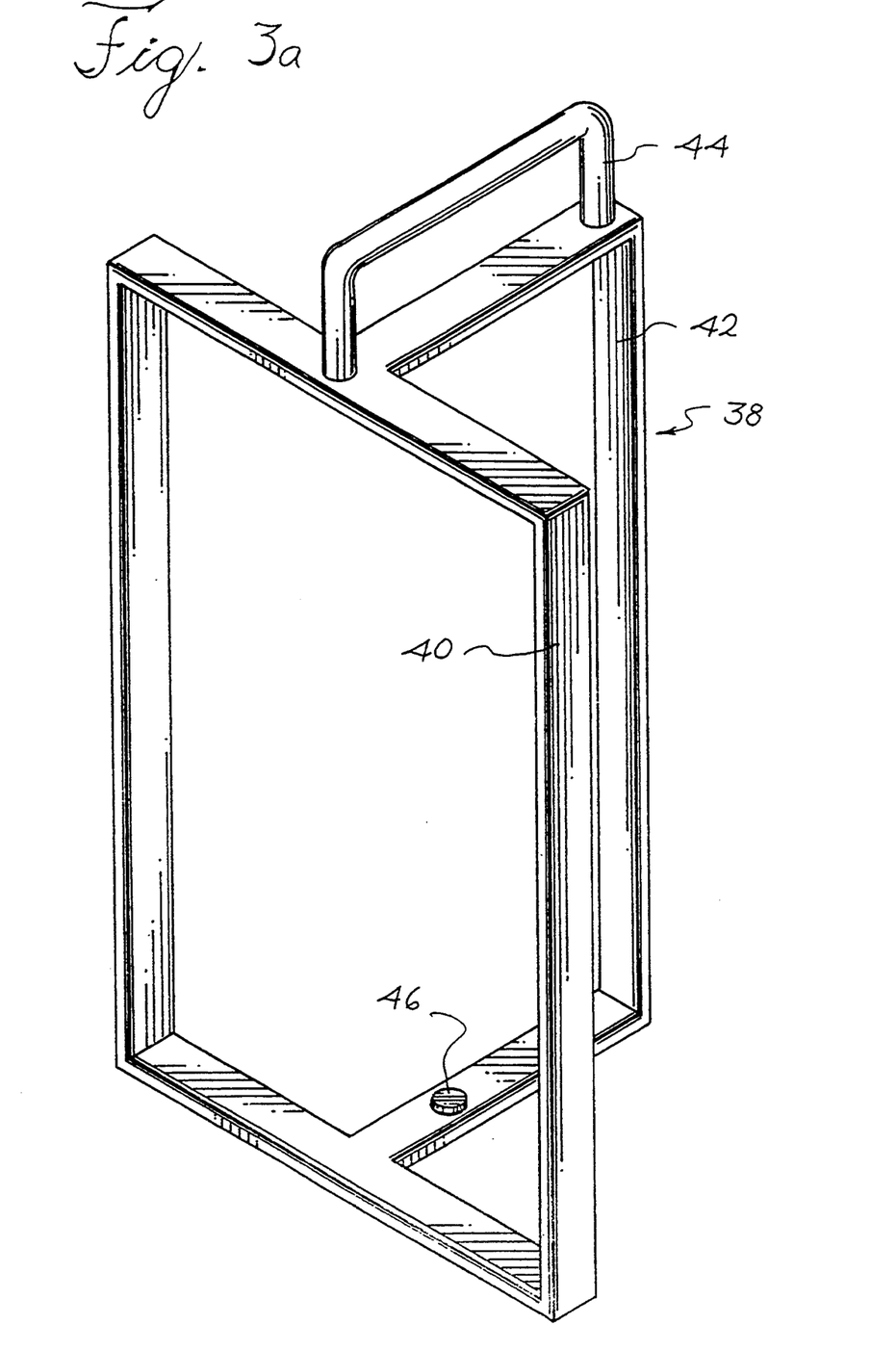
FIG. 3a is a perspective view of a cassette carrier.
Figure 3B:
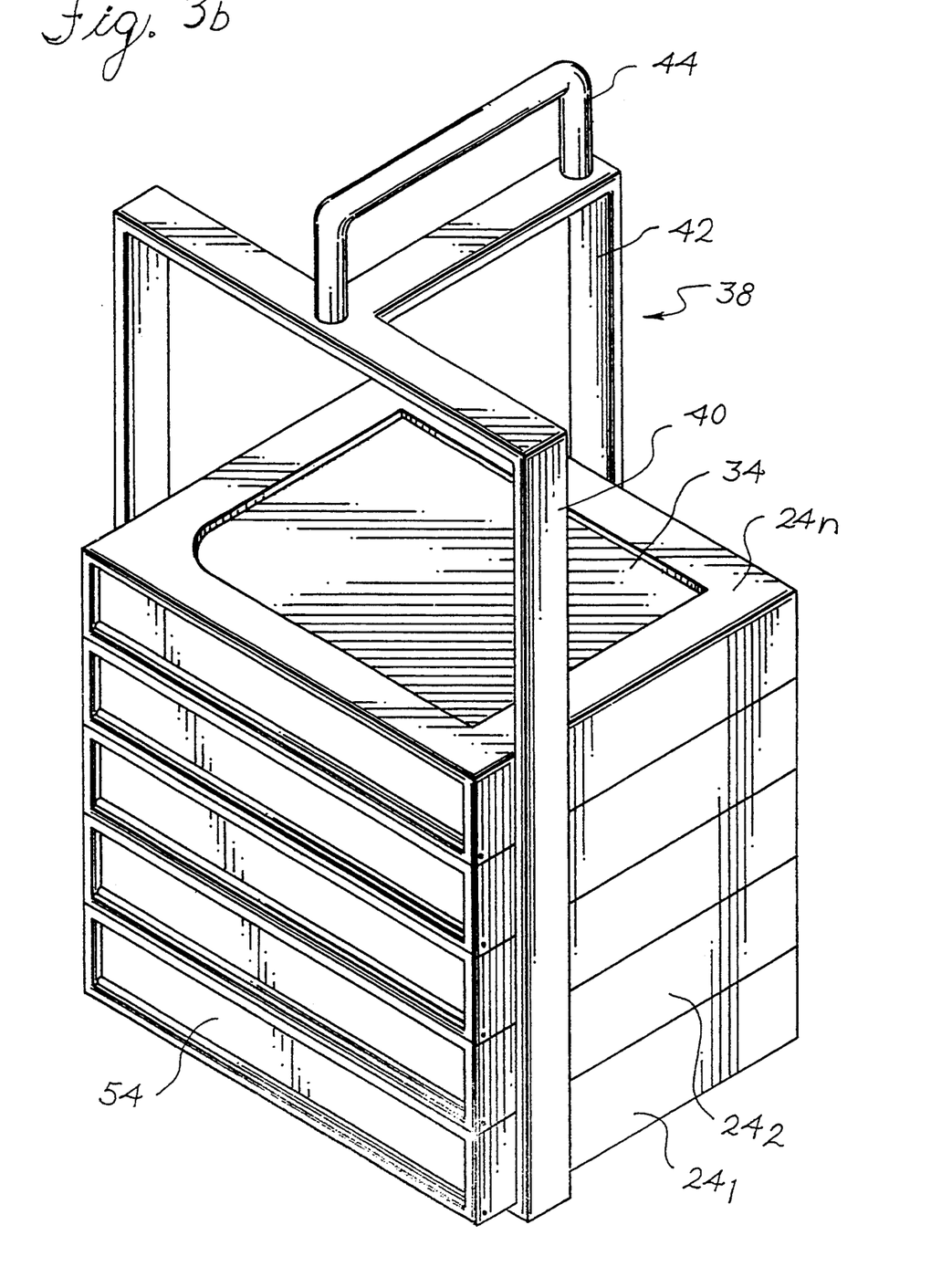
FIG. 3b is a perspective view of the cassette carrier with inserted cassettes.

In addition, there is a cassette carrier 38 as shown in FIGS. 3a and 3b. Cassette carrier 38 consists of a surrounding vertical frame 40 adjoined by a vertical frame portion 42 arranged in line therewith. Viewing from the top, this yields a T-shaped structure into which the stacked cassettes $24_1$ to $24_n$ may be inserted, with frame 40 and frame portion 42 retaining the cassettes on three sides, as shown in FIG. 3b. At the top end of frame portion 42, a handle 44 is arranged by which the cassette carrier 38 may be picked up by hand and transported. On the lower horizontal bar of the frame portion 42, an upward-pointing centering projection 46 is arranged in the center of cassette carrier 38. In the center on their bottom side 26, cassettes 24 are provided with a centering indentation 48. When the cassette stack is inserted into the cassette carrier 38, the centering projection 46 of the latter engages the centering indentation 48 of the bottom-most cassette $24_1$ of the stack, so that the entire stack is centered in the cassette carrier 38 and does not slip.

The top surface of the lifting plate 22 is formed with a T-shaped milled recess 50 corresponding to the shade of the lower horizontal bars of the frame 40 and the frame portion 42 of the cassette carrier 38. The cassette carrier 38 with the inserted cassette stack $24_1$ to $24_n$ can thus be placed on the lifting plate 22, with the lower bars of the frame 40 and the frame portion 42 engaging the recess 50 such that their surfaces are flush with the surface of the indentation 36 of the lifting plate 22. As a result, the cassettes 24 in the cassette carrier 38 are accurately positioned at the same level on lifting plate 22, regardless of whether the cassettes $24_1$ to $24_n$ are placed on the lifting plate 22 with the carrier 38 or directly without same.

Each cassette 24 accommodates one substrate 52. In the illustrated example, substrate 52 is a square multilayer ceramic substrate. The arrangement according to the invention is of course also suitable for other substrates and other substrate shapes, provided the shape of the cassette 24 accommodating the substrate 52 matches the shape and the dimensions of the substrate.

The housing of cassettes 24 is closed on all sides. When the cassettes are placed on the lifting plate 22 in an oriented fashion, only the side wall of the cassettes 24 facing the loading slot 12 is open and may be sealed by a sealing flap 54. Sealing flap 54, pivotable about its lower edge by means of journal pins 56, is supported in the housing of the cassette 24. The sealing flap 54 is slightly recessed in the direction of the edges of the cassette 24 to protect the latter from damage, contact and contamination.

Inside the cassettes 24, a substrate drawer 58 is provided. The substrate drawer 58 has a horizontally arranged U-shaped support bracket 60 which extends across the entire internal surface of the cassette 24 and is open in the direction of the sealing flap 54. The two front ends of the support bracket 60 are formed with one crossbar 62 each pointing outwards parallel to the sealing flap 54. The two outer ends of the cross-bars 62 are each provided with a guide rod 64 extending at a spacing parallel to the side legs of the support bracket 60 into the interior of the cassette 24. The guide rods 64 are axially guided in a bearing block 66 with a minimum of friction by means of a spherical rotary bushing or another suitable linear guide element. Inner partitions 68 of the cassette housing arranged on either side of the support bracket 60 separate the cassette space accommodating the support bracket 60 from lateral chambers 70 in which the guide rods 64 along with the bearing blocks 66 are arranged. The inner partitions 68 extend all the way from the bottom side 26 to the top side 32 of the cassette and from the rear side wall right up to the sealing flap 54.

For withdrawing and inserting the substrate drawer 58, the guide rods 64 are engaged by an actuator mechanism which is also enclosed by the housing of the lifting means.

Figure 7A:
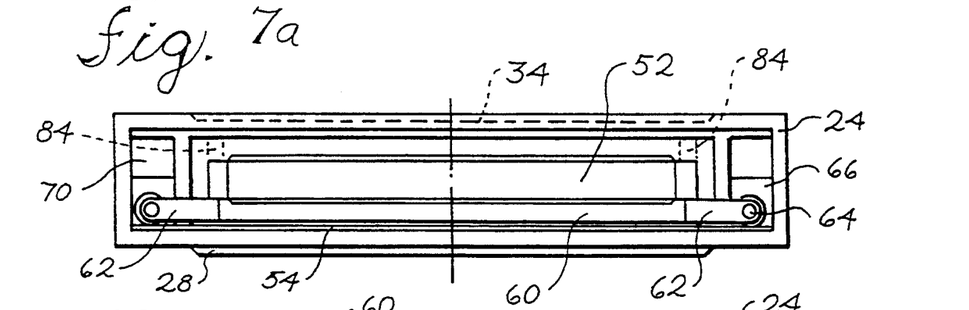
FIG. 7a is a side view of a first embodiment of the cassette with opened sealing flap.
Figure 7B:
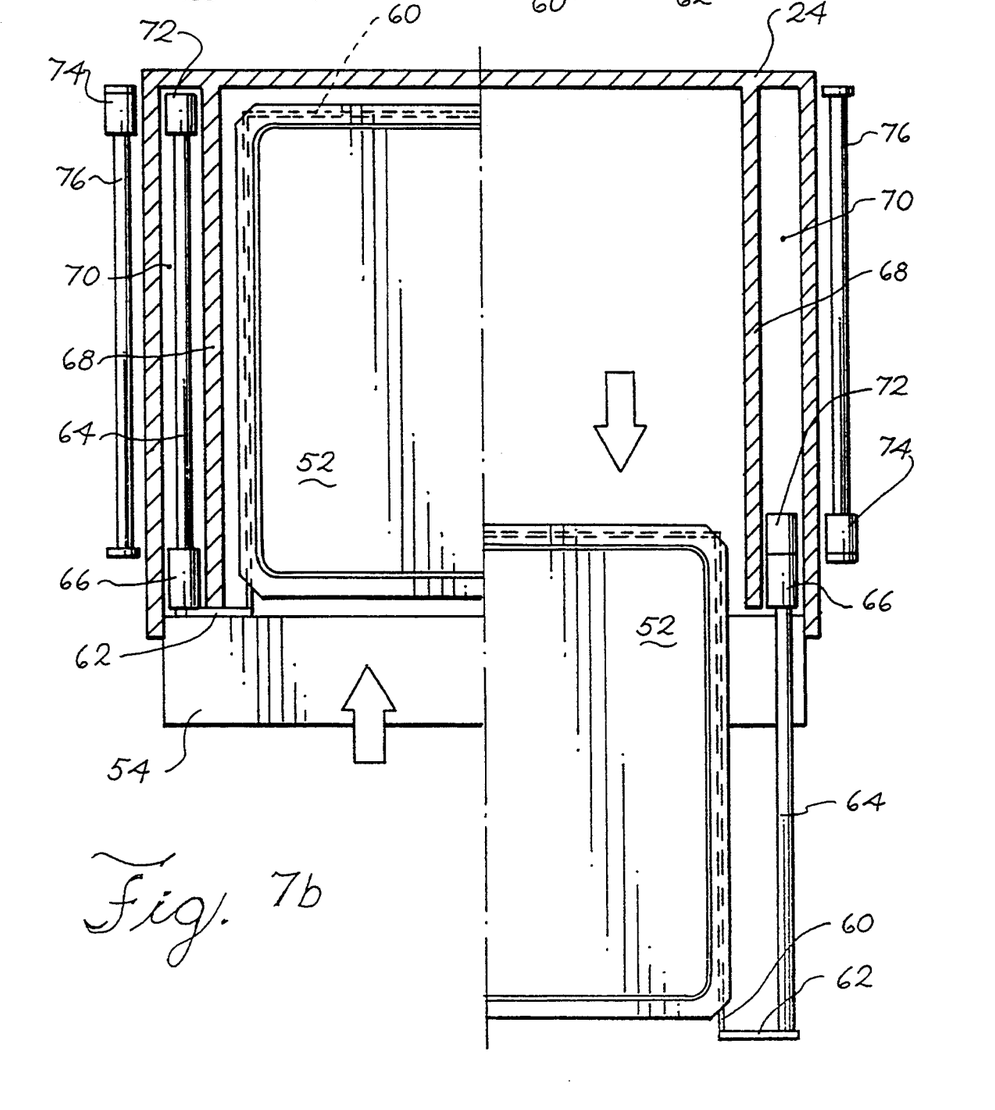

In the example illustrated in FIGS. 7a and 7b, a non-contacting magnetic actuator mechanism is provided. A permanent magnet 72 is fixed to the free rear end of the guide rods 64. Through the closed side walls of cassette 24, magnets 74, Which are actuated and movable on guides 76, act without contact on the permanent magnets 72. In the lifting means 18, guides 76 are permanently positioned in front of the loading slot 12 such that they are arranged on either side of the cassette 24 in front of the loading slot 12 and parallel to the guide rods 64. Magnets 74 may be permanent magnets or electromagnets. Permanent magnet 72 may also be replaced by an element of ferromagnetic material.

Figure 8A:
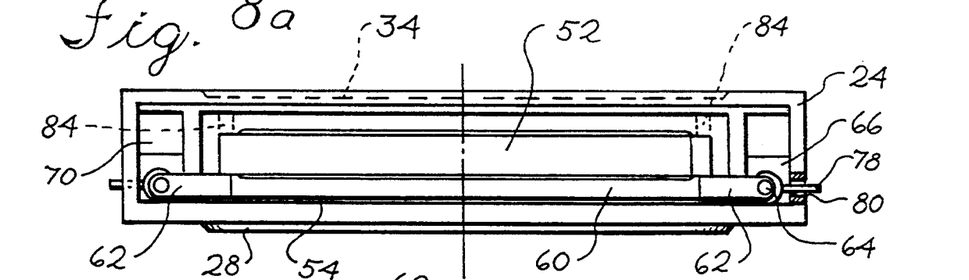
FIG. 8a is a side view of a second embodiment of the cassette with opened sealing flap.
Figure 8B:
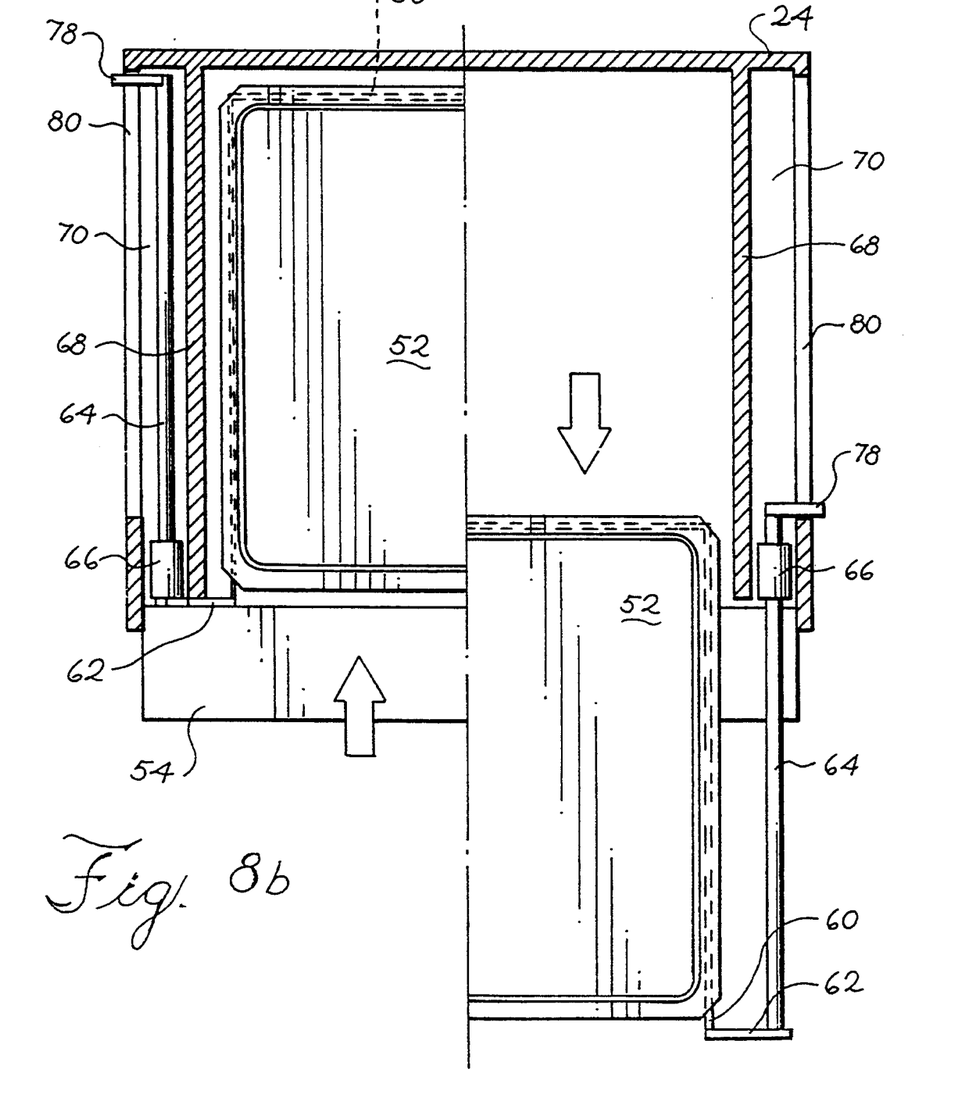

In a further embodiment shown in FIGS. 8a and 8b, the free rear ends of the guide rods 64 are each provided with a cam 78 protruding laterally from a slot 80 in the side wall of the cassette 24. In the lifting means 18, mechanically actuated movable cam elements, not shown, meshing with the cam 78 for inserting or withdrawing the substrate drawer 58, are provided on either side of the cassette 14 located in front of the loading slot 12.

Figure 9A:
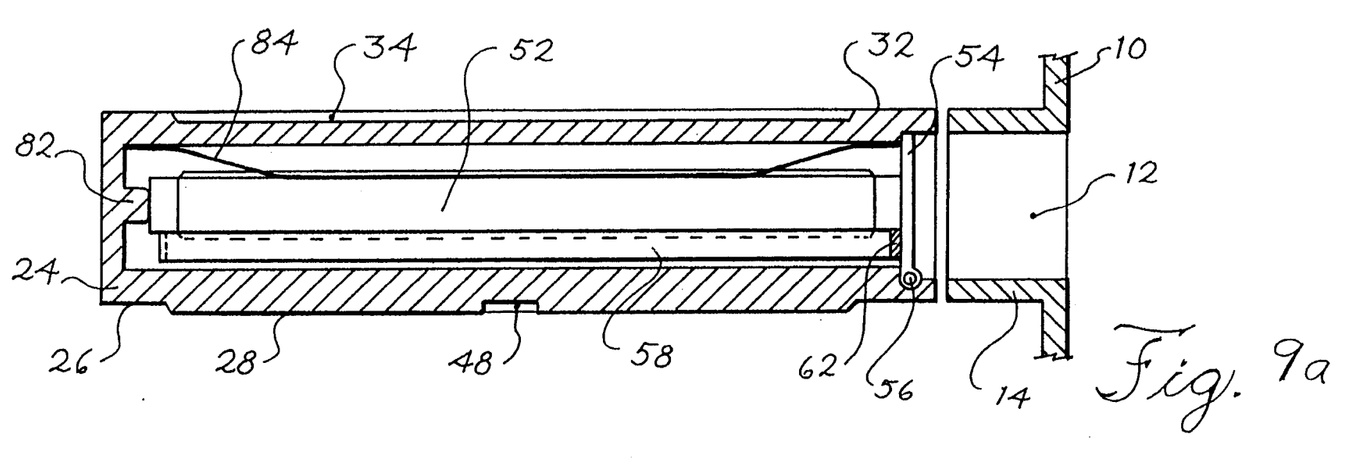
FIG. 9a is a vertical sectional view of the cassette with closed sealing flap.
Figure 9B:
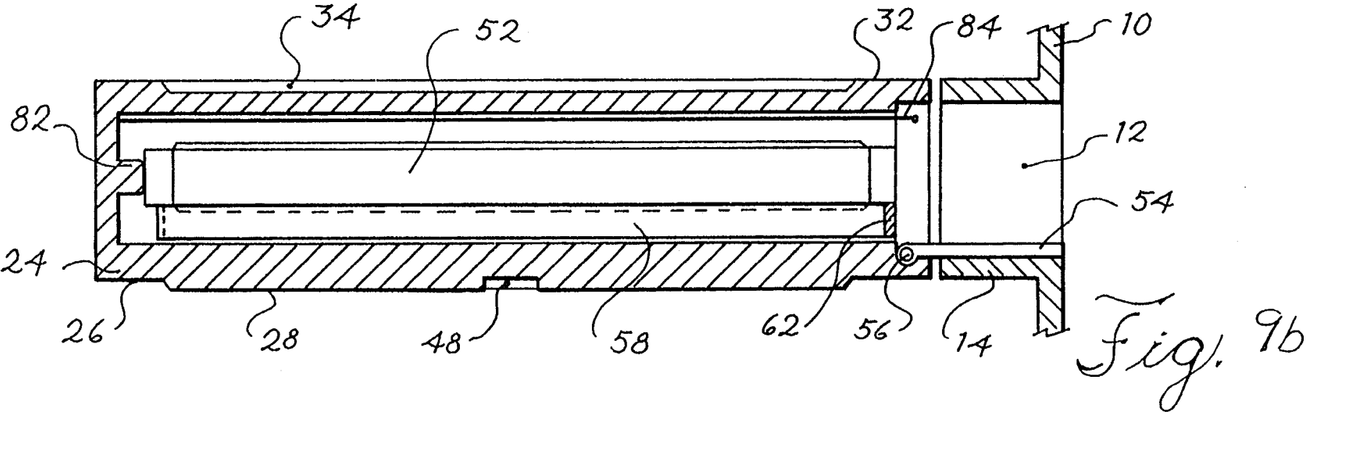
FIG. 9b is a vertical sectional view according to FIG. 9a with opened sealing flap.

Substrate 52 is inserted from the top into the support bracket 60 for the substrate drawer 58. In the illustrated example of a multi-layer ceramic substrate, the edges of the latter extending beyond the active surfaces rest on the support bracket 60. When the sealing flap 54 is closed, as shown in FIG. 9a, it presses against the front edge of the substrate 52, forcing the latter back such that its rear edge is pressed against a stop 82 in the rear side wall of the cassette 24. Stop pins (or elements), laterally securing the substrate in its position, may be provided on the two legs of the support bracket 60. As a result, substrate 52 is undisplaceably secured in its plane. On the inside of the top surface 32 of the cassette, leaf springs 84 are arranged on either side which extend above and parallel to the two legs of the support bracket 60. The rear end of the two leaf springs 84 opposite to the sealing flap is in each case secured to the top side 32 of the cassette 24. Their front end is free, protruding slightly towards the front from the opening in the cassette 24 when the sealing flap 54 is opened, as shown in FIG. 9b. When the sealing flap 54 is closed, as shown in FIG. 9a, it presses axially against the protruding end of the leaf springs 84 such that they resiliently bent downward, coming to rest on the edge of the substrate 52 and resiliently forcing the latter against the support bracket 60.

Thus, when the sealing flap is closed, the substrate is undisplaceably secured in its plane by the sealing flap 54 and the stop 82, in addition to being perpendicularly secured relative to its plane by the leaf springs 84. As a result, the cassette 24 may be transported and handled when the sealing flap 54 is closed, without the risk of the substrate 52 accommodated in the cassette 24 being damaged or displaced.

The arrangement operates as follows.

An operator places a stack of cassettes $24_1$ to $24_n$ on the lifting plate 22 of the lifting means 18 either directly or by means of the cassette carrier 38. At that stage the lifting plate 22 is in its top loading position, as shown in FIG. 1. The cassette stack is then moved downward under control of the lifting means 18 until the bottommost cassette $24_1$ is positioned in front of the loading slot, as shown in FIG. 2.

Then, the sealing flap 54 of the cassette 24, positioned in front of the loading slot 12, is opened by a mechanism, not shown, folding down into the loading slot 12 and coming to rest with its outer surface, that may be contaminated, on the lower lip 14 of the loading slot 12. Any such contaminations of the outer surface of the sealing flap 54 are thus enclosed between flap 54 and lip 14 and prevented from reaching the substrate. The clean air flow exiting from the clean room through the loading slot 12 passes through the space between the cassette 24 and the lips 14 to the outside and prevents dust particles from entering the cassette 24. By means of the actuator mechanism arranged on either side, the substrate drawer 58 is then moved out of the cassette 24, as shown by a broken line in FIG. 2 and on the right half in FIGS. 7b and 8b. Subsequently, using a handling means, the substrate 52 may be withdrawn from the substrate drawer 58 for treatment.

Upon completion of treatment, the substrate 52 is inserted into the substrate drawer 58 in the reverse order and returned to the cassette 24, as shown in the left half of FIGS. 7b and 8b.

Abraded particles caused by the guide means for guide rods 64 in the bearing blocks 66 are kept by inner partitions 68 from the cassette space accommoding the substrate 52. When the sealing flap 54 is open, the clean air flow 16 exiting through the loading slot 12 prevents abraded particles from the lateral chambers 70 from reaching the substrate 52 through their front opening. In the embodiment of FIGS. 8a and b, the clean air flow 16 also prevents dust particles from entering through the lateral slits 80 of the cassette wall. When the sealing flap 54 is closed, it rests against the front face of the inner partitions 68, sealing the lateral chambers 70 from the cassette space accommodating the substrate 52.

The cassettes $24_1$ to $24_n$ stacked in the lifting means 18 may be successively handled, with the substrates 52 being subjected to the same treatment. An automatically controlled handling in an arbitrary order, using different treatment processes, is also conceivable. A particularly high degree of flexibility is ensured by a transparent window 86 in the side wall of the cassette 24 opposite the sealing flap 54, as shown in FIG. 5. Through this window an identifier provided along the edge of the substrate 52 may be optically scanned and converted into control commands for the treatment of the substrates 52 and the transport and storage of the cassettes 24 accommodating the substrates.

We claim:

1. Arrangement for storing and transporting substrates under clean room conditions and for loading the substrates into a clean room, wherein sealable cassettes (24) each accommodating one substrate are provided and the clean room comprises an outer partition (10) having a loading slot (12), that the cassettes (24) have a sealing flap (54) in one side wall that the cassettes (24) are provided with a substrate drawer (58) which supports the substrate (52) and can be moved out through the opened sealing flap (54), that the cassettes (24) with their sealing flap (54) are alignable to the loading slot (12), and that there are mechanisms for opening the sealing flap (54) and for moving the substrate drawer (58) to a position external to the loading slot (12).

2. Arrangement according to claim 1, characterized in that the loading slot (12) has lips (14) projecting towards the outside in the direction of the positioned cassette (24).

3. Arrangement according to claim 2, characterized in that the sealing flap (54) by pivoting about one of its longitudinal edges opens towards the outside, resting in its open position on the inner surface of one lip (14) of the loading slot (12).

4. Arrangement according to claim 1, characterized in that outside the partition (10) of the clean room external to the loading slot (12) a lifting means (18) is arranged which accommodates several stacked cassettes (24) and successively positions them at the loading slot (12), and that the lifting means (18) is enclosed in a housing, and that the loading slot (12) and the mechanisms for opening the sealing flap (54) and for moving out the substrate drawer (58) are positioned inside said housing.

5. Arrangement according to claim 1, characterized in that the cassettes (24) on their top side (32) and their bottom side (26) are formed with complementary indentations (34) and protrusions (28) for positive stacking.

6. Arrangement according to claim 5, characterized in that the lifting means (18) has a lifting plate (22), the surface of which is provided with a protrusion or an indentation (36) complementary to the indentations or protrusions (28) on the bottom side (26) of the cassettes (24).

7. Arrangement according to claim 6, characterized in that several cassettes (24) are stackable in a cassette carrier (38) which may be placed on the lifting means (18).

8. Arrangement according to claim 7, characterized in that the cassette carrier (38) is insertable into a milled recess (50) in the top surface of the lifting plate (22) of the lifting means (18) so that the cassettes (24) in the cassette carrier (38) placed on the lifting plate (22) assume the same position as the cassettes (24) placed directly on the lifting plate (22).

9. Arrangement according to claim 1, characterized in that the substrate drawer (58) has a U-shaped support bracket (60) which is open in the direction of the sealing flap (54) and which supports the substrate (52).

10. Arrangement according to claim 1 or 9, characterized in that the substrate drawer (58) comprises on either side actuators guided and movable in the direction in which drawer (58) is moved out, said actuators being engaged by the move-out mechanism and being preferably arranged in a lateral chamber (70) of the cassette (24), which is separated by an inner partition (68) from the space of the cassette (24) accommodating the substrate (52).

* * * * *